United States Patent [19]

Hopfield et al.

[11] Patent Number: 4,719,591
[45] Date of Patent: Jan. 12, 1988

[54] OPTIMIZATION NETWORK FOR THE DECOMPOSITION OF SIGNALS

[75] Inventors: John J. Hopfield, Pasadena, Calif.; David W. Tank, Summit, N.J.

[73] Assignees: American Telephone and Telegraph Company, AT&T Bell Labs., Murray Hill, N.J.; Calif. Institute of Technology, Pasadena, Calif.

[21] Appl. No.: 795,789

[22] Filed: Nov. 7, 1985

[51] Int. Cl.$^4$ ............................................. G06F 15/46
[52] U.S. Cl. .................................... 364/807; 364/300
[58] Field of Search ............... 364/807, 300, 131, 900, 364/828, 829, 800, 808, 811, 815

[56] References Cited

U.S. PATENT DOCUMENTS

| | | | |
|---|---|---|---|
| 3,934,231 | 1/1976 | Armstrong | 364/900 |
| 4,326,259 | 4/1982 | Cooper | 364/900 |
| 4,551,817 | 11/1985 | Ishikawa | 364/807 |
| 4,580,227 | 4/1986 | Lavergnat | 364/807 |
| 4,635,037 | 1/1987 | Iwamura | 364/807 |
| 4,660,166 | 4/1987 | Hopfield | 364/807 |

OTHER PUBLICATIONS

"Linear Programming on an Electronic Analogue Computer", *Trans. AIEE, Part I (Comm. & Elect.)*, vol. 75, I. B. Pyne, 1956, pp. 139-143.

*Primary Examiner*—Michael R. Fleming
*Attorney, Agent, or Firm*—Henry T. Brendzel

[57] ABSTRACT

A network comprising analog amplifiers with a resistive interconnection matrix that connects each amplifier output to the input of all other amplifiers. The connections embodied in the matrix are achieved with conductances whose values are computed in accordance with the set of decomposition functions for which the solution is sought. In addition to the specified connectivity implemented. Further included is a second matrix that connects externally applied voltages to the amplifier inputs via resistors whose values are also computed in accordance with the set of decomposition functions for which the solution is sought. Still further and in accordance with another aspect of the invention, means are included for varying the amplifier gains from an initial low value to an ultimately high value in the process of arriving at a solution to an applied problem.

10 Claims, 6 Drawing Figures

OPTIMIZATION NETWORK FOR THE DECOMPOSITION OF SIGNALS

BACKGROUND OF THE INVENTION

This relates to apparatus for parallel processing of signals, and in particular, to apparatus for highly parallel computation leading to the decomposition of signals into component signals.

Digital computers are ubiquitous and quite powerful, but that is not to say that digital computers do not exhibit certain limitations in problem solving. Many practical problems, in fact, take such an enormous amount of computation that a solution in real time is not possible. Such difficulties are experienced, for example, in programs that aim to select from memory the information that best satisfies known characteristics or descriptors (which may be referred to as "clues") when the clues are insufficient to completely define the information. Pattern recognition is another example of where the computational problem is just too great for digital computers.

Most artisans either suffer the limitations of general purpose digital computers or develop special purpose digital computers to solve their particular problems more efficiently.

In a copending application entitled "Electronic Network For Collective Decision Based On Large Number Of Connections Between Signals", by J. J. Hopfield, a generalized circuit was disclosed having N amplifiers of high gain and an N×N interconnection matrix having N input conductors and N output conductors. The amplifiers exhibit a sigmoid input-output relation, with a minimum and a maximum possible output which can be thought of as a "0" and a "1". Each input conductor of the matrix is connected to the input of a separate one of the amplifiers, and each amplifier has its output terminals (positive and negative) connected to a separate one of the matrix output conductors. Each amplifier has in addition an input capacitance $C_i$ and an input resistance $\rho_i$. Within the interconnection matrix each input conductor i is connected to an output conductor j through a resistor $R_{i,j}$. In the disclosed circuit each amplifier satisfies the circuit equation of motion:

$$C_i(du_i/dt) = -u_i/R_i + \sum_j T_{ij}V_j + I_i$$

where $\frac{1}{R_i} = \frac{1}{\rho_i} + \sum_j \frac{1}{R_{ij}}$, where $T_{ij} = \left[\left(\frac{1}{R_{ij}}\right) \cdot \text{sgn of amplifier } j \text{ output}\right]$, $u_i$ is the input voltage to amplifier i, $V_j$ is the output voltage of an amplifier j, and $I_i$ is the current into the input terminal of amplifier i (e.g., from a high impedance source).

The motion of the disclosed circuit (as specified by the above equation) drives the network to one of a set of predetermined stable states which presents an output pattern of binary 1's and 0's (since the amplifiers have a high gain).

When used for accessing information in a associative memory, the input voltages of amplifiers i are set in correspondence with the individual bits of the input word for each clue (descriptor) known for the information desired. Alternatively, a constant current $I_i$ can be applied to each input in proportion to the confidence that the voltage $V_i$ should be at "1" in the final answer. Once started, the amplifiers drive to a stable state, producing at the output a unique word that represents the information itself, which could include the address of a location in another memory which may then yield a block of words that comprise the information defined by the descriptor used to store and retrieve the unique word from the associative memory.

When used for problem solutions, all inputs may be set approximately equal, such as to zero, or held in a pattern representing input information, and the output pattern of bits "1" and "0" define the solution. In either application, problem solving or information retrieval, the output in binary form is a very good solution to the given problem.

Although the disclosed circuit quickly and efficiently reaches a stable solution state, it is not guaranteed that the optimal solution to a given problem is obtained. This is because the topology of the solution space is very rough, with many local minima, and therefore many good solutions are similar to the optimal solution. In difficult robotics and biological problems of recognition and perception, very good solutions that are rapidly calculated may provide sufficient information to be of practical use, but in some applications it is the exact, or best, solution that is desired.

It is an object of this invention to employ a network of analog processors in connection with decomposition processes.

SUMMARY OF THE INVENTION

These and other objects are achieved with a highly interconnected analog network that is constructed to implement a specific decomposition process. The network comprises analog amplifiers that are connected with a resistive interconnection matrix which, like the prior art network, connects each amplifier output to the input of all other amplifiers. The connections embodied in the matrix are achieved with conductances whose values are computed in accordance with the set of decomposition functions for which the solution is sought. In addition to the specified connectivity implemented with the interconnection matrix, the analog network of this invention includes a second matrix that connects externally applied voltages to the amplifier inputs via resistors whose values are also computed in accordance with the set of decomposition functions for which the solution is sought. In accordance with another aspect of our invention, our circuit is caused to reach its solution by a process of simulated annealing, whereby the amplifier gains are initially set at low values and then slowly increased to their ultimate high value. This process inhibits the circuit from being directed to a local minima.

DETAILED DESCRIPTION

Figure 1:
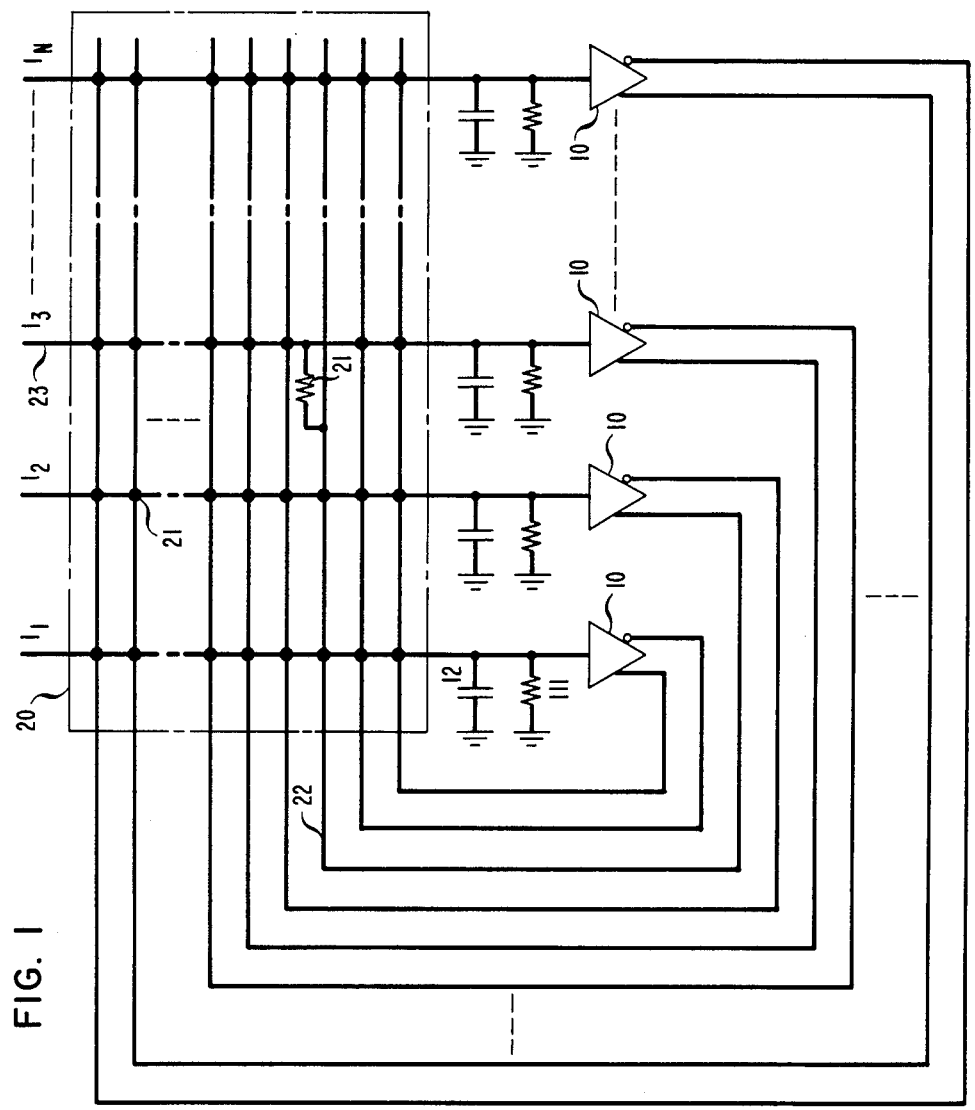
FIG. 1 describes the prior art highly interconnected analog network.

FIG. 1 is a schematic diagram of a computational multi-processor network disclosed in the aforementioned co-pending application. It comprises amplifiers 10 which provide positive gain and, optionally, negative gain, whose inputs and outputs are interconnected via interconnection network 20. A physical embodiment of an amplifier would necessarily include some impedance at the input that is primarily resistive and capacitive. It is represented in FIG. 1 by resistors 11 ($\rho_i$) and capacitors 12 ($C_i$). Each node in interconnection matrix 20 is represented by a heavy black dot 21 and it comprises a resistor $R_{ij}$ which connects a path of matrix 20 that is connected to an output of amplifier i, e.g. path 22, with a path of matrix 20 that is connected to an input of amplifier j, e.g. path 23. In addition, the FIG. 1 circuit allows for externally applied currents to be fed into paths 23 that connect to inputs of amplifiers 10. Current $I_i$ represents the input current to path 23 that connects to amplifier i. The voltage $V_i$ represents the output voltage of amplifier i.

The equation of motion describing the time evolution of the FIG. 1 circuit is:

$$C_i(du_i/dt) = -u_i/R_i + \sum_{j=1}^{N} T_{ij}V_j + I_i, \quad (1)$$

where $u_i$ is the input voltage of amplifier i, $g_i$ is the transfer function of amplifier i, i.e., $$V_j = g_j(u_j), \text{ and } 1/R_i = 1/\rho_i + \sum_{j=1}^{N} 1/R_{ij}.$$

It has been shown in the aforementioned co-pending application that when the equation $$E = -\tfrac{1}{2}\sum_i\sum_j T_{ij}V_iV_j + \sum_i (1/R_i) \int_0^{V_i} g_i^{-1}(V)dV - \sum_i I_iV_i. \quad (2)$$

is considered, and when the terms $T_{ij}$ and $T_{ji}$ are equal and the gain of the amplifiers is very large, then the time derivative of equation (3) reduces to $$dE/dt = -\sum_i \frac{dV_i}{dt}\left(\sum_j T_{ij}V_j - u_i/R_i + I_i\right). \quad (3)$$

The parenthetical expression in equation (3) is equal to the right hand side of equation (1). That means that the change (with time) of input voltage at amplifier i multiplied by the change (with time) of the output voltage at amplifier i, summed over all the amplifiers, is equal to the dE/dt of equation (3), and is equal to:

$$dE/dt = -\sum C_i[dg_i^{-1}(V_i)/dV_i](dV_i/dt)^2. \quad (4)$$

Since each of the terms in equation (4) non-negative, dE/dt is negative, and approaches 0 (stability) when $dV_i/dt$ approaches 0 for all i.

The above analysis means that a presented problem that meets the conditions set forth for the above equations can be solved by the circuit of FIG. 1 when the values of $T_{ij}$ and the input currents $I_i$ are appropriately selected, an initials set of the amplifier input voltages is provided, and the analog system is allowed some time to converge on a stable state.

One class of problems that can conveniently be solved in this manner is the class of decomposition problems where it is sought to represent an input signal with a "best fit" set of other non-orthogonal signals. One example is the A/D conversion problem. Another example is the decomposition of a complex signal (as represented by a sequence of voltage samples) into a set of preselected functions.

To more clearly describe our invention, the following describes the approach taken in accordance with the principles of our invention to solve the A/D conversion problem. Thereafter, the concepts described are expanded to cover the entire class of decomposition problems.

In connection with the A/D conversion process it is known that conversion of a signal from analog representation to digital representation means that an analog signal x is approximately equal to the weighted sum of the developed digital signals $\{V_1, V_2, \ldots V_N\}$ that are supposed to represent x. That is, a signal x', which is an approximation of the signal x can be expressed as:

$$x' = \sum_{i=0}^{(N-1)} V_i 2^i \quad (5)$$

One conventional measure of "goodness" of x' is the square of the difference between the signal x and the signal x'. That concept is embodied in the following equation:

$$E = \tfrac{1}{2}(x - x')^2 \text{ or } \tfrac{1}{2}\left(x - \sum_{i=0}^{(N-1)} V_i 2^i\right)^2. \quad (6)$$

Equation (6) states that the optimum value of x' results in a minimized value of E. Expanding equation (6) and rearranging it results in a form similar to that of equation (1), plus a constant, and that indicates that an A/D converter might indeed be implemented with a circuit not unlike that of FIG. 1.

Unfortunately, the minima of the function defined by equation (6) do not necessarily lie near enough to 0 and 1 to be identified as the digital logic levels that an A/D converter must develop. In accordance with the principles of this invention, we circumvent this problem by adding an additional term to the energy function of equation (6). We chose the term $$-\tfrac{1}{2}\sum_{i=0}^{(N-1)} (2^i)^2[V_i(V_i - 1)] \quad (7)$$

because it favors digital representation since it reduces to zero when all of the $V_i$ terms are restricted to 0 or to 1. When equation (7) is combined with equation (6) and rearranged, the equation $$E = -\tfrac{1}{2}\sum_{j=0}^{(N-1)}\sum_{i \neq j=0}^{(N-1)} (-2^{i+j})V_iV_j - \quad (8)$$

-continued $$\sum_{i=0}^{(N-1)} (-2^{(2i-1)} + 2^i x) V_i + \text{constant}.$$

results, which is also in the form of equation (1), if we identify the connection matrix elements and the input currents as:

$$T_{ij} = -2^{(i+j)}$$

and $$I_i = (-2^{(2i-1)} + 2^i x).$$

Figure 2:
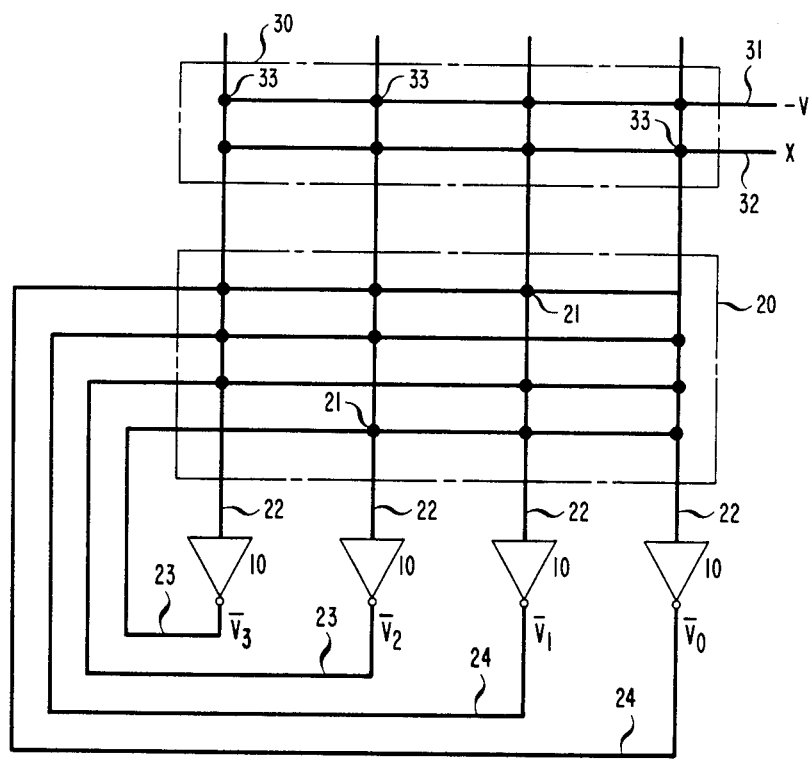
FIG. 2 describes a network constructed in accordance with the principles of our invention for implementing a four bit A/D conversion process.

FIG. 2 depicts a four bit A/D converter circuit in accordance with the principles of our invention that is constructed with a connection matrix that satisfies equation (8). It comprises inverting amplifiers 10 having input lines 22 and output lines 23, a connection matrix 20 which connects lines 23 to lines 22 via nodes 21, and a connection matrix 30 which connects a reference voltage $-V$ (e.g., $-1$ volt) on line 31, and an input signal x on line 32. Both signals $-V$ and x communicate with lines 22 via nodes 33.

In accordance with the specification of equation (8), each $T_{ij}$ element takes the value $2^{i+j}$ (except where i=j—where $T_{ij}$ does not exist). These are the connection strengths depicted in FIG. 2. Also in accordance with the specification of equation (8), each input current $I_i$ takes on the value $-2^{2i-1} + 2^i x$. Matrix 30 realizes these currents via the depicted connection strengths which represent conductances of specified value.

As indicated earlier, the A/D conversion process is presented herein for illustrative purposes only and that, in accordance with the principles of our invention, many decomposition processes can be achieved with a circuit like the one of FIG. 2.

If, for example, $\vec{\epsilon_k}$ represents a set of basic functions (such as, for example, gaussian functions) which span the signal space $\vec{x}$ (signal samples), then the function $$E = \frac{1}{2}\left(\vec{x} - \sum_k V_k \vec{\epsilon_k}\right)\left(\vec{x} - \sum_k V_k \vec{\epsilon_k}\right) - \tag{9}$$

$$\frac{1}{2}\sum_k (\vec{\epsilon_k} \cdot \vec{\epsilon_k})[V_k(V_k - 1)]$$

describes a network which has an energy minimum when the "best fit" digital combination of the basic functions are selected (with $V_i = 1$) to describe the signal. The term $\vec{\epsilon_k} \cdot \vec{\epsilon_k}$, by the way, means the dot products of the signal $\vec{\epsilon_k}$ with itself. Equation (9) can be expanded and rearranged to assume the form $$E = \frac{1}{2}\sum_k \sum_{k \neq 1} (\vec{\epsilon_k} \cdot \vec{\epsilon_l}) V_k V_l - \tag{10}$$

$$\sum_k [(\vec{x} \cdot \vec{\epsilon_k}) - \frac{1}{2}(\vec{\epsilon_k} \cdot \vec{\epsilon_k})] V_k - \frac{1}{2}(\vec{x} \cdot \vec{x})$$

and equation (10) is in the form of equation (1), plus a constant. That is, as with equation (8), the $T_{ij}$ terms and $I_i$ terms can be defined to make equation (10) appear identical to equation (1), thereby yielding a correspondence between the elements in the equation and the physical parameters of the FIG. 2 network. Specifically for equation (10), $$T_{ij} = -(\vec{\epsilon_i} \cdot \vec{\epsilon_j}) \text{ where } i \neq j \tag{11}$$

and $$I_i = [(\vec{x} \cdot \vec{\epsilon_i}) - \frac{1}{2}(\vec{\epsilon_i} \cdot \vec{\epsilon_i})]. \tag{12}$$

An example may be in order.

Figure 3:
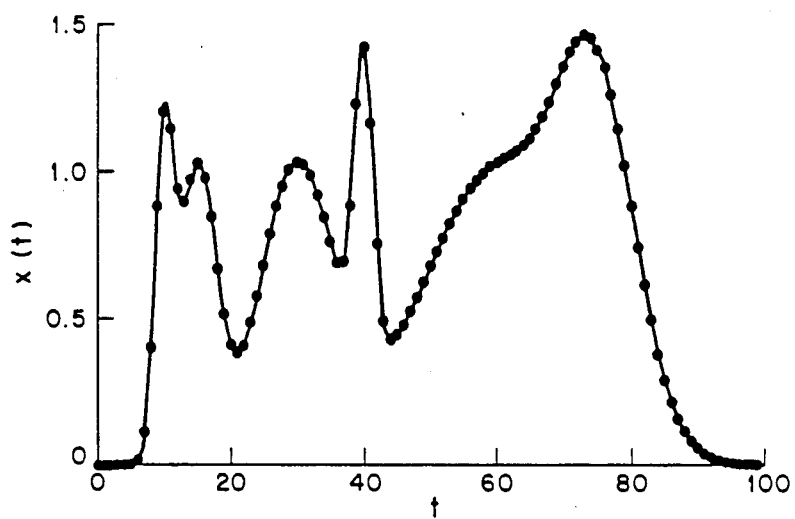
FIG. 3 depicts a sampled signal that may be decomposed by the network of this invention.
Figure 4:
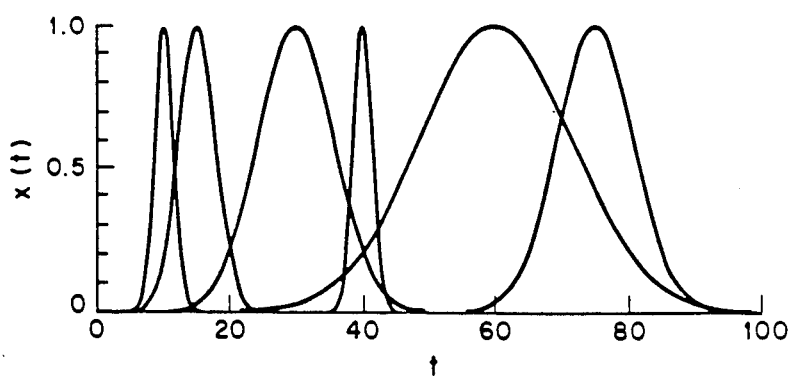
FIG. 4 depicts a plurality of gaussian functions that, when combined, form the sampled signal of FIG. 3.

Consider the problem of decomposing a time sequence of analog signals which result from the linear summation of temporally disjoint gaussian pulses of differing widths. A typical summed signal is shown in FIG. 3 and the different gaussian pulses of which it is comprised are shown in FIG. 4. The decomposition process must determine this particular subset of all the possible basis functions that, when added together, recreate the signal of FIG. 3. As indicated by dots 100 on the curve of FIG. 3, a plurality of samples are available from the signal of FIG. 3, and those samples comprise the analog data $x_i$, where $1 = 1, 2, \ldots, N$. The basis set, defining all possible "pulses" are the gaussian functions of the form $$\epsilon_{\sigma t} = e^{-[(i-t)/\sigma]^2} \tag{13}$$

where the width parameter, $\sigma$, takes on a finite number of values, while the peak position of the pulse t, can be at any one of the N instances where the samples of the FIG. 3 signal are taken. Since the basis set is specified by the two parameters, width and peak position, the amplifiers used in the decomposition network can be conveniently indexed by the double set of indices, $\sigma, t$. In describing the decomposition, each of these basis functions will have digital coefficient ($V_{\sigma t}$) which corresponds to the output of an amplifier in the network and which represents the presence or absence of this function in the signal to be decomposed. That is, a $V_{20,10} = 1$, for example, means that a gaussian function with a peak at the time of sample 20 and a width of 10 is present in the solution set.

With the above in mind, the energy function which describes an analog computational network that will solve this particular decomposition problem is:

$$E = \frac{1}{2}\sum_{i=1}^{N}\left(x_1 - \sum_{\sigma=\sigma_1}^{\sigma_{max}}\sum_{t=1}^{N} V_{\sigma t}\epsilon_{\sigma t}(i)\right)^2 - \tag{14}$$

$$\frac{1}{2}\sum_{i=1}^{N}\sum_{\sigma=\sigma_1}^{\sigma_{max}}\sum_{t=1}^{N} (\epsilon_{\sigma t}(i))^2[V_{\sigma t}(V_{\sigma t} - 1)]$$

with the basis function as defined in equation 12. This expression defines a set of connection strengths $T_{\sigma t, \sigma' t'}$ and input currents $I_{\sigma t}$, with:

$$T_{\sigma t, \sigma' t'} = \sum_{i=1}^{N} e^{-[[\frac{(i-t)}{\sigma}]^2 + [\frac{(i-t')}{\sigma}]^2]} \tag{15}$$

$$I_{\sigma t} = \sum_{i=1}^{N} x_i e^{-[\frac{(i-t)}{\sigma}]^2} + \frac{1}{2}\sum_{i=1}^{N} e^{-2[\frac{(i-t)}{\sigma}]^2} \tag{16}$$

A computational network for implementing the above processing is essentially identical to the network shown in FIG. 2. The only difference is that instead of a single input signal x, there is a plurality of input signal samples $x_i$, and each is connected to a line 32 which, through connection matrix 30, feeds currents to amplifiers 10 in accordance with equation (16). This circuit is shown in its general form in FIG. 5, with lines 32-1 through 32-4 comprising the plurality of input lines, to each of which a signal sample is connected and through which each signal sample is connected to all amplifiers.

As demonstrated, our circuit seeks a minimum stable state, but it has a number of other stable states which constitute local minima. This condition is depicted in FIG. 6 by curve 100, where the lowest stable state occurs at circuit state 54, at point 104, and local minima exist at states 51, 52, 53, 55, 56, 57, 58, and 59, corresponding to points 101-109 (exclusive of 104) on curve 100, respectively.

We have discovered that the gain of amplifiers 10 in our circuit exhibits control over the shape of curve 100 in a manner that is not dissimilar to the process of annealing. As in some spin glass problems where the effective field description followed continuously from high temperatures to lower temperatures is expected to lead to a state near the thermodynamic ground state, in our circuits we start with low amplifier gains and slowly increase the gains to their ultimate levels. This yields better computational results.

Figure 6:
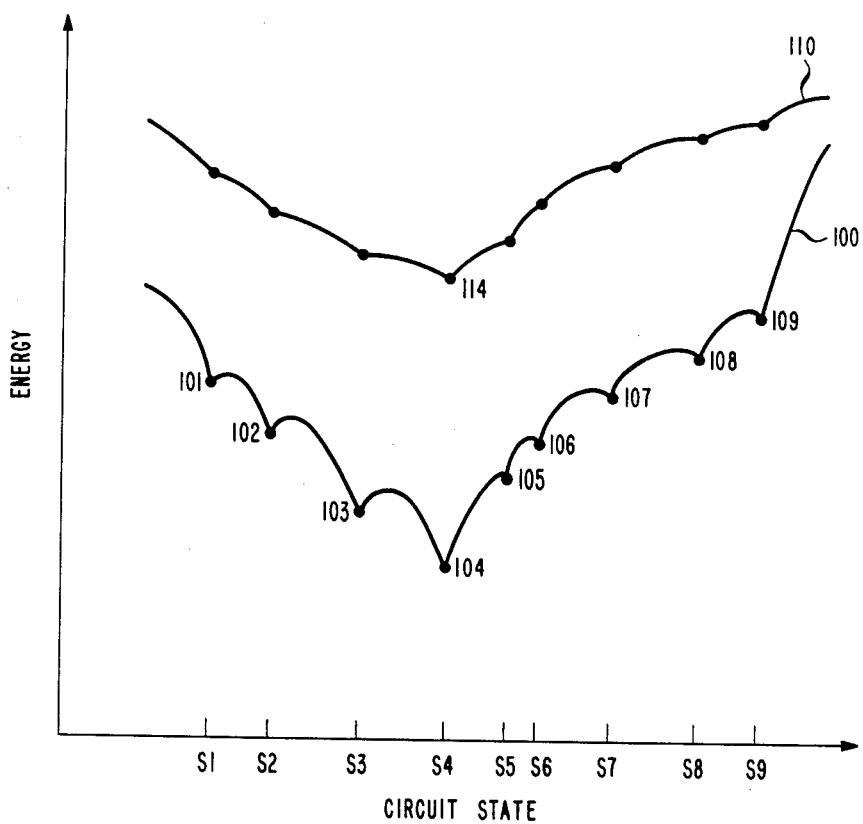
FIG. 6 describes the behavior of our circuit in response to varying magnitude of amplifier gains.

This behavior can heuristically be understood by observing that curve 110 in FIG. 6, which corresponds to the circuit energy function when the gain is low, has discontinuities in the slope of the curve at points corresponding to states 51 through 59 (corners), but the curve is still monotonically increasing or decreasing on either side of point 114 which is the minimum point of curve 110. The other corners in the curve are not local minima and, therefore, when we set the gains at a low value our circuit will not come to rest at those points but would move to point 114. When the gain is increased, our circuit easily and quickly settles at the minimum point, i.e., point 104.

Beginning a computation in a low gain state initializes the circuit. In a situation with changing inputs, as for example the A to D converter measuring a fluctuating voltage, the best operation of the circuit may require re-initializing the gain for each new decision.

Figure 5:
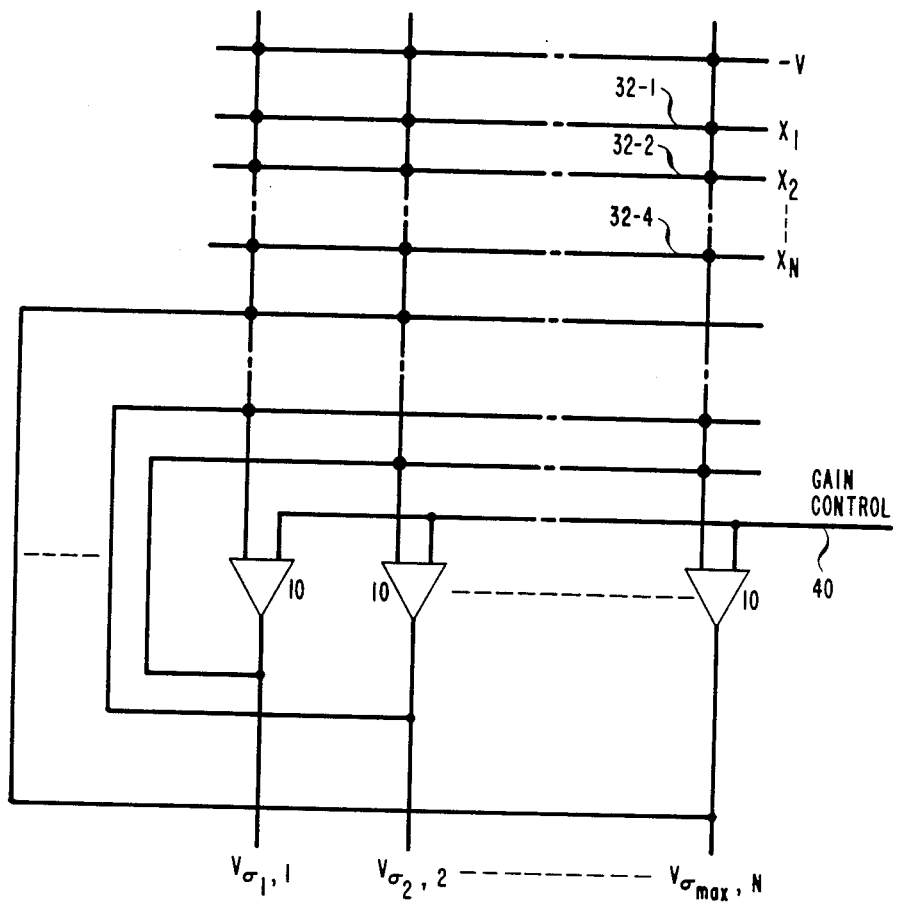
FIG. 5 illustrates a network for performing a decomposition of a signal comprising a plurality of samples.

The gain control feature, which can be implemented in a conventional manner, is illustrated in FIG. 5 by a line 40 that is connected to a gain control point on all amplifiers 10. Changing the voltage on line 10 changes the gain of amplifiers 10, yielding the desired "annealing" action or re-initializing.

What is claimed is:

1. A circuit for determining a best fit to input signals with a selected set of basis functions $\vec{e}_k$, which are signal functions of a preselected variable, said circuit comprising:
   an N plurality of gain-providing amplifiers, where N is a chosen number with each amplifier $A_i$ having an input terminal and output terminal; and conductance devices of conductance value $T_{ij}$, with each conductance device connecting said output terminal of amplifier $A_i$ to the input terminal of amplifier $A_j$, i and j being subscripts that denote a particular of said amplifiers and conductance devices wherein each of said conductance values $T_{ij}$ is related to the dot product of the $i^{th}$ basis function $\vec{e}_i$ and the $j^{th}$ basis function $\vec{e}_j$.

2. The circuit of claim 1 further comprising a current $I_i$ injected into said input terminal of amplifier $A_i$, with said current $I_i$ being related to the dot product of said input signals with $\vec{e}_i$ and to the dot product of $\vec{e}_i$ with itself.

3. The circuit of claim 1, wherein each of said amplifiers includes a gain control port, and said circuit further comprises means for varying the gain of said amplifiers.

4. The circuit of claim 1, further comprising means for setting the gain of said amplifiers at a low level and increasing said gain to its ultimate high level to obtain a stable output of said circuit.

5. A circuit for decomposing an input signal comprising one or more input voltages in terms of a selected set basis functions $\vec{e}_k$, that are signal functions of a preselected variable, said circuit including, a plurality of gain-providing amplifiers $A_i$ where i is an index designating a particular amplifier in said plurality of amplifiers, said amplifier $A_i$ having input and output terminals and said circuit including a first interconnection matrix for connecting the output terminal of each amplifier $A_i$ to the input terminal of each other amplifier $A_j$ via a conductance device having a conductance value $T_{ij}$ characterized by:
   a second interconnection matrix for coupling a portion of a preselected bias voltage and a portion of said input voltages to said input terminal of each of said amplifiers.

6. The circuit of claim 5, further comprising means for varying the gain of said amplifiers.

7. The circuit of claim 5 wherein said conductance values $T_{ij}$ are related to a dot product of said basis functions, and wherein said second interconnection matrix connects said preselected bias voltage and said input voltages to said input terminals via conductances that are related to said basis functions.

8. The circuit of claim 5 wherein said conductance values $T_{ij}$ are related to a dot product of $\vec{e}_i$ and $\vec{e}_j$, where $\vec{e}_i$ and $\vec{e}_j$ are members of the set of nonorthogonal functions $\vec{e}_k$ and wherein said second interconnection matrix connects said preselected bias voltage to said input terminal of each said amplifier $A_i$ via a conductance that is related to the dot product of $\vec{e}_i$ with itself, and connects each of said input voltages to said input terminal of each said amplifier $A_i$ via a conductance that is related to said $\vec{e}_i$.

9. An A/D converter responsive to an input voltage comprising:
   a plurality of amplifiers $A_i$ having input and output terminals and a first interconnection matrix for connecting the output terminal of each amplifier $A_i$ to the input terminal of each other amplifier $A_j$ via a conductance device of conductance value $T_{ij}$ that connects the output terminal of amplifier $A_i$ to the input terminal of amplifier $A_j$, i and j being indices that designate particular amplifiers and conductances;
   a second interconnection matrix for connecting a preselected applied bias voltage $-v$ and said input voltage to said input terminal of each of said amplifiers;
   wherein the value of each $T_{ij}$ is set to $-2^{(i+j)}$ for $i \neq j$ and to 0 for $i = j$ and wherein said second interconnection matrix connects said preselected bias voltage to said input terminal of amplifier $A_i$ via a conductance having the value $2^{(2i-1)}/v$ and connects said inputs voltage to said input terminal of amplifier $A_i$ via a conductance having the value $2^i$.

10. A circuit comprising a plurality of amplifiers, with each amplifier i having an input capacitor C, an input resistor $\rho$ and developing an output signal $V_i$ in response to an input signal $u_i$ at the amplifier's input terminal, and a connection matrix for interconnecting the output signal $V_i$ of each amplifier i to said input terminal of each of said amplifiers through a set of conductances of conductance value $T_{ij}$, where j designates amplifier j to whose input $T_{ij}$ is connected, i and j being indices that designate particular amplifiers and conductances characterized by:

an input signal $I_i$ being injected into said input terminals of each amplifier i;

said amplifiers including means for controlling the magnitude of the gain developed by said amplifiers;

the value of each conductance $T_{ij}$ selected for the nature of the decisional operation intended to satisfy the circuit equation of motion $$C(du_i/dt) = u_i/R_i + \sum_j T_{ij}V_j + I_i$$

where $\dfrac{1}{R_i} = \dfrac{1}{\rho_i} + \sum_j T_{ij}$ and;

said circuit including means for varying said gain of said amplifiers.

* * * * *